United States Patent
Holmes et al.

(10) Patent No.: US 9,013,246 B2
(45) Date of Patent: Apr. 21, 2015

(54) COUPLER WITH DISTRIBUTED FEEDING AND COMPENSATION

(71) Applicant: Freescale Semiconductor, Inc., Austin, TX (US)

(72) Inventors: Damon G. Holmes, Scottsdale, AZ (US); Jeffrey K. Jones, Chandler, AZ (US); Joseph Staudinger, Gilbert, AZ (US); Michael E. Watts, Scottsdale, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 161 days.

(21) Appl. No.: 13/957,075

(22) Filed: Aug. 1, 2013

(65) Prior Publication Data
US 2015/0035604 A1    Feb. 5, 2015

(51) Int. Cl.
| | |
|---|---|
| *H03H 7/01* | (2006.01) |
| *H03F 3/21* | (2006.01) |
| *H01P 1/18* | (2006.01) |
| *H01P 5/02* | (2006.01) |
| *H01P 5/12* | (2006.01) |

(52) U.S. Cl.
CPC ............... *H03F 3/211* (2013.01); *H01P 1/184* (2013.01); *H01P 5/028* (2013.01); *H01P 5/12* (2013.01)

(58) Field of Classification Search
CPC .................................... H01P 1/18; H03F 3/211
USPC .......................... 333/118, 117, 131, 132, 138
See application file for complete search history.

(56) References Cited

U.S. PATENT DOCUMENTS

| | | | |
|---|---|---|---|
| 4,893,098 A | 1/1990 | Seely et al. | |
| 5,045,821 A | 9/1991 | Staudinger et al. | |
| 5,237,287 A * | 8/1993 | Bar-David | 329/308 |
| 5,937,341 A | 8/1999 | Suominen | |
| 7,084,717 B2 | 8/2006 | Okazaki et al. | |
| 7,446,630 B2 | 11/2008 | Chan et al. | |
| 2010/0244981 A1 * | 9/2010 | Gorbachov | 333/124 |
| 2012/0200370 A1 | 8/2012 | Wright | |

OTHER PUBLICATIONS

Yansheng Xu et al, A Novel Structure of Tightly Coupled Lines for MMIC/MHMIC Couplers and Phase Shifters, vol. 45, No. 9.
H.I Cantu et al, Comparison of MMIC Lumped and Quasi-lumped Quadrature Coupler Performance29-31Manchester, UK.
P. Abele et al, Si MMIC Quadrature Hybrid Coupler for 1.35GHz83-86Ulm, Germany.

* cited by examiner

*Primary Examiner* — Dinh Le
(74) *Attorney, Agent, or Firm* — S. Jared Pitts; Griffiths & Seaton PLLC

(57) ABSTRACT

The embodiments described herein can provide improved signal feeding between hybrid couplers and associated transistors. As such, these embodiments can improve the performance of amplifiers and other such RF devices that utilize these components. In one embodiment a device includes a distribution network and a compensation resonator. The distribution network is configured to output a signal through a relatively wide output feedline. This relatively wide output feedline provides distributed signal feeding that can improve signal distribution and performance. The output feedline is coupled to the compensation resonator. In general, the compensation resonator is configured to resonate with the distribution network at the frequency band of the signal. Thus, the distribution network and compensation resonator together can provide improved signal distribution while maintaining performance at the frequencies of interest.

20 Claims, 7 Drawing Sheets

COUPLER WITH DISTRIBUTED FEEDING AND COMPENSATION

TECHNICAL FIELD

Embodiments of the subject matter described herein relate generally to electronic devices, and more particularly to couplers used in radio frequency (RF) semiconductor applications.

BACKGROUND

Radio frequency telecommunication systems commonly employ directional couplers, hybrids, power splitters and combiners as building blocks for various tasks such as signal routing, combining and monitoring. In addition, these systems may employ power amplifiers that use multiphase couplers to satisfy key performance metrics over a large frequency bandwidth.

Generally, multiphase couplers are implemented using an arrangement of distributed transmission lines in close proximity. To reduce circuit area, however, it is desirable to use lumped element components wherever possible using monolithic microwave integrated circuits (MMIC).

Lumped element MMIC couplers can be designed to operate over a large frequency bandwidth as shown in U.S. Pat. No. 5,045,821. However, performance is significantly reduced when interfacing such couplers to large active semiconductor devices with wide distributed bus bars.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

Figure 1:
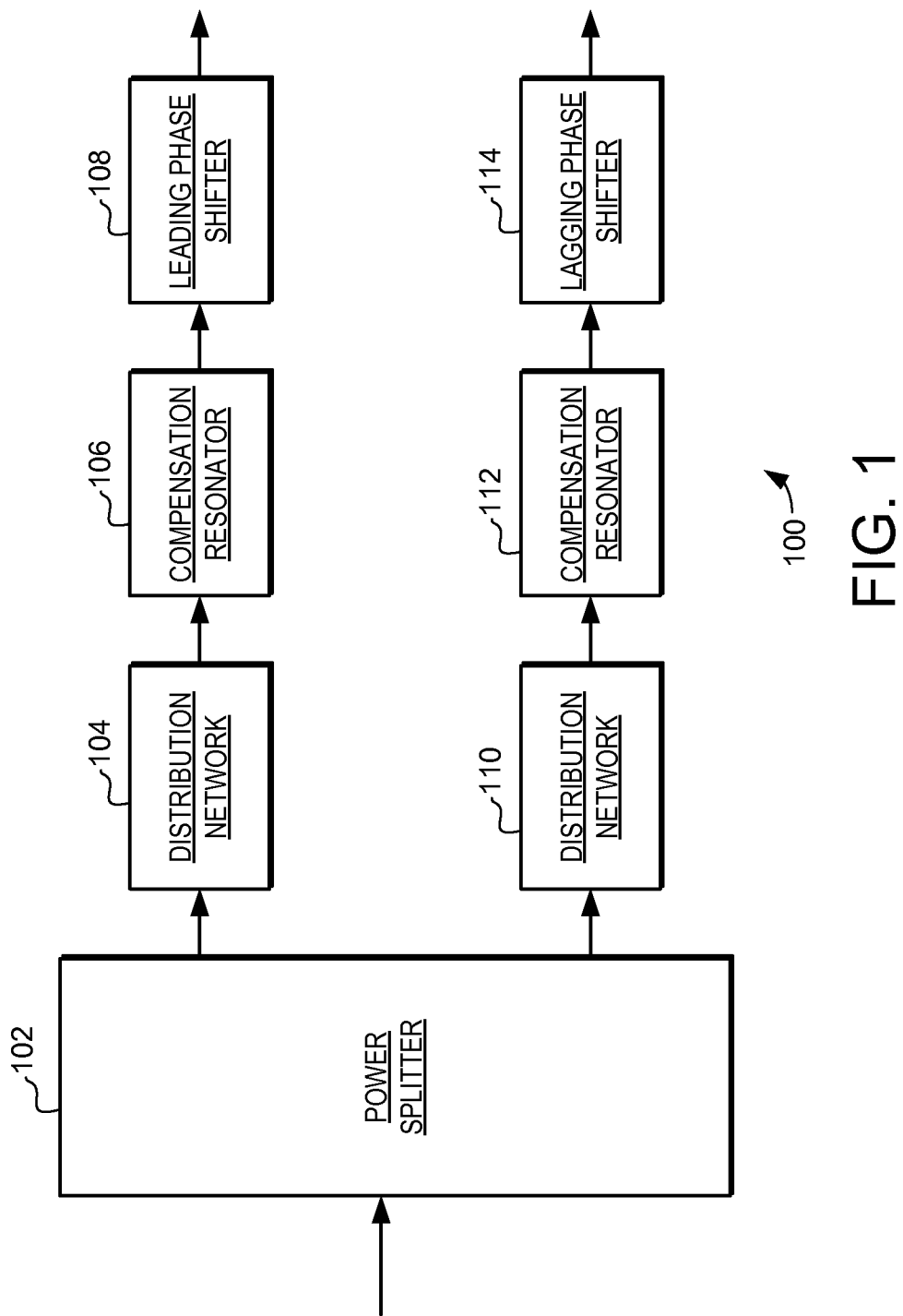
FIG. 1 is a schematic diagram of a semiconductor device in accordance with an example embodiment.

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

The embodiments described herein can provide semiconductor devices with improved performance and/or increased density. Embodiments include devices such as hybrid couplers and amplifiers that are typically used in radio frequency (RF) applications. In general, a hybrid coupler is a type of directional coupler used to divide power between two output ports (either equally or unequally). They are commonly used in a variety of devices, including those designed for RF applications.

As one specific example, hybrid couplers are commonly used in balanced amplifier implementations. In general, balanced amplifiers are amplifiers that use multiple amplifying devices (e.g., transistors) that are run in quadrature (i.e., 90 degrees apart in phase). In balanced amplifiers, the hybrid couplers are used to generate two phase-shifted signals that are 90 degrees out of phase, and these two signals are then amplified separately and combined again with a second coupler. Balanced amplifiers provide a variety of useful features, such as reduced reflection and increased immunity to load pull effects.

In general the embodiments described herein provide improved signal feeding between hybrid couplers and associated transistors. As such, these embodiments can improve the performance of amplifiers and other such RF devices that utilize these components. In one embodiment a device includes a distribution network and a compensation resonator. The distribution network is configured to output a signal through a relatively wide output feedline. For example, the distribution network can be configured with an output feedline that is comparable in width to the bus bar of a downstream transistor. This relatively wide output feedline provides distributed signal feeding that can improve signal distribution. Specifically, the relatively spatially wide output feedline produces a largely constant signal across the device, and such a constant signal can improve performance. The output feedline is coupled to the compensation resonator. In general, the compensation resonator is configured to resonate with the distribution network at the frequency band of the signal. Thus, the distribution network and compensation resonator together provide improved signal distribution while maintaining performance at the frequencies of interest.

As will be discussed in more detail below, in one embodiment the device comprises a multiphase hybrid coupler that includes a power splitter, a first power distribution network, a first compensation resonator, a second power distribution network, a second compensation resonator, a leading phase shifter, and a lagging phase shifter. The power splitter includes a first output terminal and a second output terminal configured to output an operating signal having a wavelength. The first power distribution network includes a first input node and a first output feedline, the first input node coupled to the first output terminal of the power splitter. In one particular embodiment the output feedline of the first power distribution network has a first output connection width equal to at least 10 percent of the operating signal wavelength. Likewise, the second power distribution network includes a second input node and a second output feedline, the second input node coupled to the second output terminal of the power splitter. Again, in one particular embodiment the output feedline of the second power distribution network has a second output connection width equal to at least 10 percent of the operating signal wavelength.

The first compensation resonator is coupled to the first output feedline of the first power distribution network, and the second compensation resonator is coupled to the second output feedline of the second power distribution network. The leading phase shifter is coupled to the first compensation resonator and includes an output terminal for supplying a first output signal with a first phase. The lagging phase shifter is coupled to the second compensation resonator and has an output terminal for supplying a second output signal with a second phase, where the second phase is approximately 90 degrees from the first phase. So configured, the device provides a hybrid coupler that can be used in a variety of RF circuits, including analog microwave circuits such as monolithic microwave integrated circuits (MMIC). Specifically, the distribution networks and compensation resonators with relatively wide connections can provide improved signal distribution in the coupler while maintaining performance at the frequencies of interest.

In another embodiment the device comprises a balanced power amplifier. In general, the balanced power amplifier comprises a power splitter, a first power distribution network, a first compensation resonator, a second power distribution network, a second compensation resonator, a leading phase shifter, a lagging phase shifter, a first transistor, a second transistor, a first matching network, a second matching network and an output coupler. In an embodiment the power split includes a first output terminal and a second output terminal. The first power distribution network includes a first input node and a first output feedline, the first input node coupled to the first output terminal of the power splitter. The first input node has a first input connection width, and the first output feedline has a first output connection width. The first compensation resonator is coupled to the first output feedline of the first power distribution network, and includes a first capacitor having a first electrode, wherein the first electrode has a first electrode width. The second power distribution network includes a second input node and a second output feedline, the second input node coupled to the second output terminal of the power splitter. The second input node has a second input connection width, and the second output feedline has a second output connection width. The second compensation resonator is coupled to the second output feedline of the second power distribution network, and includes a second capacitor having a second electrode, wherein the second electrode has a second electrode width. The leading phase shifter is coupled to the first compensation resonator and has an output terminal for supplying a first output signal with a first phase. The lagging phase shifter is coupled to the second compensation resonator and has an output terminal for supplying a second output signal with a second phase approximately 90 degrees from the first phase. The first transistor is coupled to the output terminal of the leading phase shifter through a first bus bar, the first bus bar having a first bus bar width. The second transistor is coupled to the output terminal of the lagging phase shifter through a second bus bar, the second bus bar having a second bus bar width. The first matching network is coupled to the first transistor, and the second matching network is coupled to the second transistor. The output coupler is attached to the first transistor and the second transistor. In an embodiment the first output connection width and the first electrode width are each within 20 percent of each other, and/or within 20 percent of the first bus bar width. Likewise, the second output connection width and the second electrode width are each within 20 percent of each other and/or within 20 percent of the second bus bar width.

So configured, the balanced amplifier provides a device that can be used in a variety of high performance RF circuits. To facilitate this, the distribution networks and compensation resonators within the balanced amplifier have relatively wide connections. Specifically, the first output connection width and the first electrode connection width are both within 20 percent of the first bus bar width. Likewise, the second output connection width and the second electrode width are both within 20 percent of the second bus bar width. Having these relatively wide widths in the power distribution networks and compensation resonators compared to the widths of the corresponding bus bars can provide improved signal distribution to the transistor while maintaining performance at the operating frequency of the transistors.

Turning now to FIG. 1, an exemplary device 100 is illustrated schematically. As will be discussed in more detail below, in one embodiment the device 100 includes a power splitter 102, a first power distribution network 104, a first compensation resonator 106, a leading phase shifter 108, a second power distribution network 110, a second compensation resonator 112, and a lagging phase shifter 114. The first power distribution network 104 has an output feedline that is coupled to the first compensation resonator 106. Likewise, the second power distribution network 110 has a second output feedline coupled to the second compensation resonator 112. The leading phase shifter 108 and lagging phase shifter 114 are coupled to their corresponding compensation resonators 106 and 112 and are configured to generate output signals that are in quadrate phase.

In general, the distribution networks 104 and 110 are configured to output signals through relatively wide output feedlines. For example, through output feedlines that are relatively wide compared to signal wavelength or comparable in width to the bus bar of a downstream transistor. These relatively wide output feedlines provide distributed signal feeding that can improve signal distribution. The compensation resonators 106 and 112 are configured to resonate with the corresponding distribution network 109 and 110 at the frequency band of the signal. Thus, the distribution networks 109 and 110 and compensation resonators 106 and 112 together can provide improved signal distribution to the phase shifters 108 and 114 while maintaining performance at the frequencies of interest.

In one embodiment this is facilitated by the output feedline having a connection width that is equal to at least about 5 percent of the operating signal wavelength (e.g., between about 5 and about 25 percent of the operating signal wavelength). In another embodiment, the output feedline may have a connection width that is between about 10 and about 20 percent of the operating signal wavelength. In yet another embodiment improved signal distribution is facilitated by having the output feedline have a connection width that is within about 20 percent of a corresponding bus bar width. In another embodiment, the output feedline may have a connection width that is within about 10 percent of a corresponding bus bar width. In any of these embodiments the output feedline connection width of the power distribution networks 104 and 110 may provide a substantially uniform voltage along the output feedlines and thus can facilitate improved signal distribution in the device 100.

Figure 3:
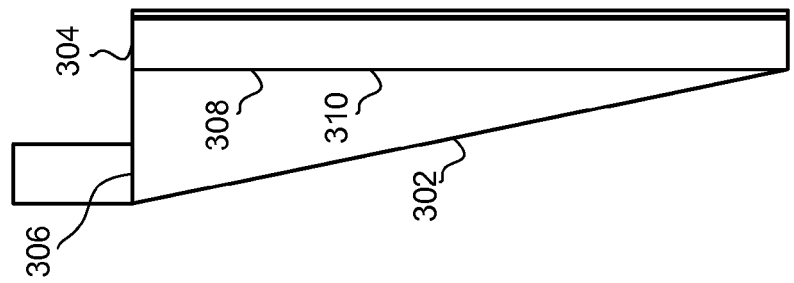
FIGS. 2-5 are top views of distribution networks and compensation resonators in accordance with example embodiments.
Figure 2:
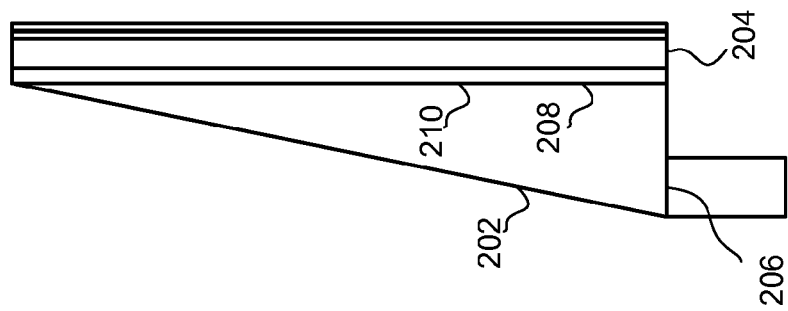

Turning now to FIGS. 2 and 3, top views of exemplary power distribution networks and compensation resonators are illustrated. Specifically, FIG. 2 shows an example of a first power distribution network 202 and a first compensation resonator 204. Likewise, FIG. 3 shows an example of a second power distribution network 302 and a second compensation resonator 304. Each distribution network includes an input node (e.g., input nodes 206 and 306) and an output feedline (e.g., output feedlines 208 and 308). In these illustrated embodiments the distribution networks 202 and 302 each comprise patterned conductors (such as microstrips) that have a substantially triangular shape used to provide a relatively wide output connection. Specifically, the use of the triangular shape results in each distribution network having a relatively narrow input connection width (i.e., the width of the interfaces between distribution networks 202 and 302 and input nodes 206 and 306) and a relatively wide output connection width (i.e., the width of the interfaces between distribution networks 202 and 302 and output feedlines 208 and 308). In other embodiments, either or both distribution networks 202 and 302 may have a shape that is different from being purely triangular. For example the distribution networks 202 and 302 can have one or more sides that are non-planer (e.g., the hypotenuse and/or one or more other sides may be slightly curved), or relatively small additional shapes and/or sides can be added while the overall shape is still substantially triangular.

In one embodiment the connection width of the input nodes 206 and 306 is less than about 20 percent the output connection width of the output feedlines 208 and 308 (e.g., between about 2 and about 20 percent). In another embodiment the connection width of the input nodes 206 and 306 is less than about 10 percent the output connection width of the output feedlines 208 and 308 (e.g., between about 5 and about 10 percent). However, in other alternate embodiments the connection width of the input nodes 206 and 306 may be greater than 20 percent the output connection width of the output feedlines 208 and 308.

In these illustrated examples each of the output feedlines 208 and 308 comprises a relatively wide edge of the triangular patterned conductor with respect to the edge on the input sides. And as such the output feedlines 208 and 308 provide relatively wide connection widths to the compensation resonators 204 and 304.

The compensation resonators 204 and 304 are each configured to resonate with their corresponding distribution network within a frequency band of interest. In the illustrated examples, each compensation resonator 204, 304 comprises a capacitor formed in series with and adjacent to their corresponding distribution network 202, 302. These capacitors are designed to compensate for the parasitic inductances of their corresponding distribution network 202, 302, and thus will resonate with the distribution network 202, 302 at the operating frequency. Furthermore, to facilitate improved signal distribution, these capacitors are formed to have relatively large electrodes. Thus, compensation resonator 204 includes a first electrode 210 and a second electrode (not shown in FIG. 2) beneath the first electrode 210 and separated from the first electrode 210 by a dielectric. Likewise, the compensation resonator 304 includes a first electrode 310 and a second electrode (not shown in FIG. 3) beneath the first electrode 310 and separated from the first electrode 310 by a dielectric. In each case these electrodes 210, 310 are configured to have relatively large area and relatively large contact with the output feedlines of the corresponding distribution network 202, 302. This can ensure that the good signal distribution provided by the distribution network 202, 302 is continued through the compensation resonators.

Figure 4:
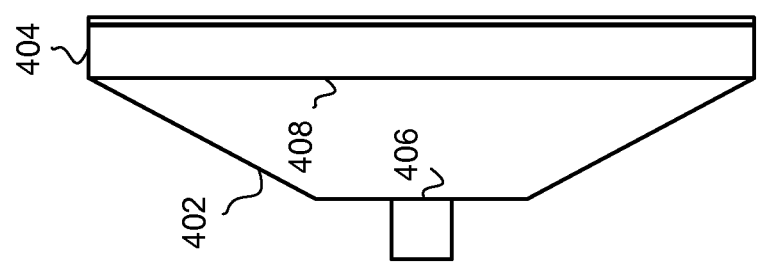

Turning now to FIG. 4, a top view of another exemplary power distribution network 402 and compensation resonator 404 is illustrated. The distribution network 402 includes an input node 406 and an output feedline 408. In this illustrated embodiment the distribution network 402 comprises a quadrilateral (in this case a trapezoid) shaped conductor that provides a relatively wide output connection. Again, the shape provides a relatively narrow input node 406 and a relatively wide output feedline 408. And as such the output feedline 408 provides a relatively wide connection width to the compensation resonator 404. And again, the compensation resonator 404 includes electrodes configured to have relatively large area and relatively large contact with the output feedline 408. This can ensure that the good signal distribution provided by the distribution network 402 is continued through the compensation resonator 404.

Figure 5:
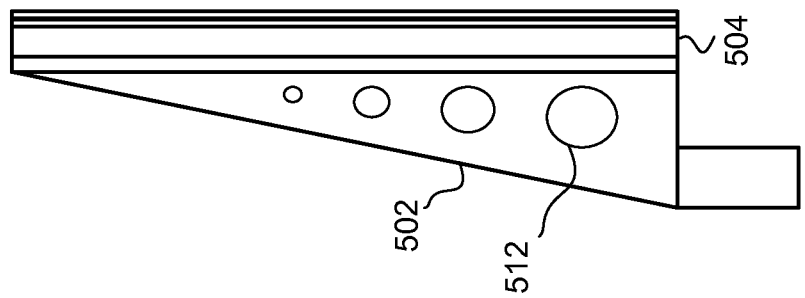

Turning now to FIG. 5, a top view of another exemplary power distribution network 502 and compensation resonator 504 is illustrated. In this embodiment the distribution network 502 again comprises a triangular shape that provides a relatively wide output connection. Also included in this distribution network 502 is a plurality of openings 512. In this embodiment the openings 512 are added to distribute the electric field across the distribution network 502. Specifically, the openings 512 in the conductive pattern are sized and positioned to improve the uniformity of the voltage across the width of the conductor. And again the relatively wide output feedline and resulting relatively wide connection width to the compensation resonator 504 may ensure that the good signal distribution provided by the distribution network 502 is continued through the compensation resonator 504.

It should be again noted that the various distribution networks and compensation resonators shown in FIGS. 2-5 are just examples of the types of structures and shapes that can be used.

Figure 6:
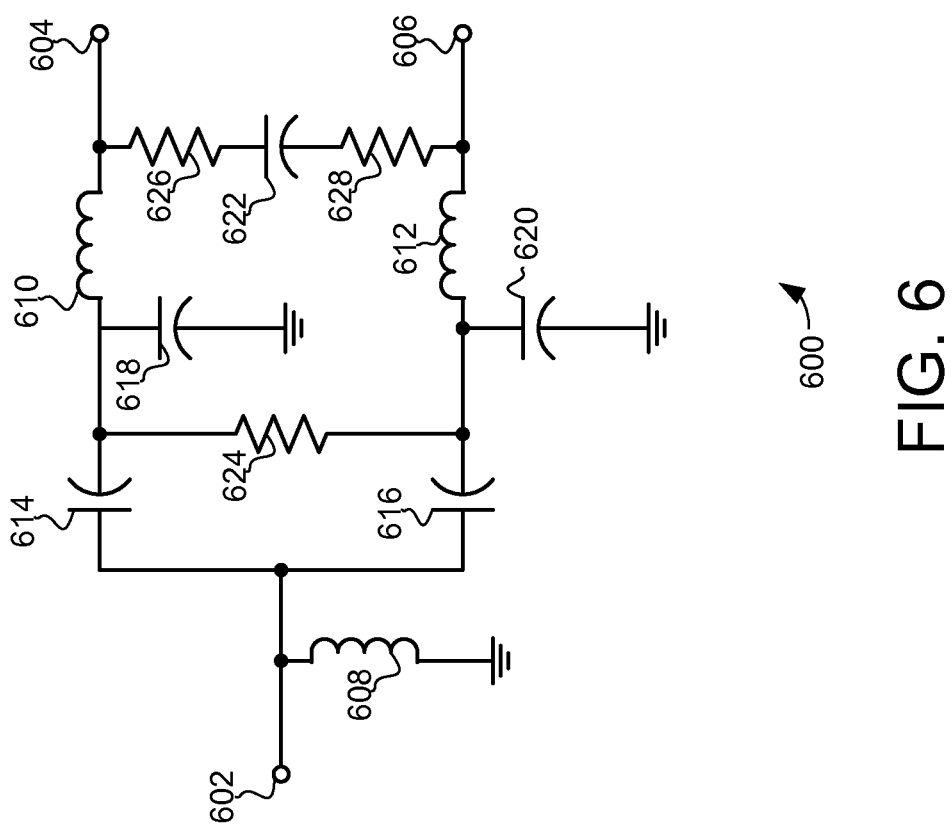
FIG. 6 is a schematic view of a power splitter in accordance with an example embodiment.

Turning now to FIG. 6, an embodiment of a power splitter 600 (e.g., power splitter 102, FIG. 1) is illustrated. The power splitter 600 is an example of a type of power splitter that can be utilized in the various embodiments described herein. The power splitter 600 is comprised of lumped resistive, capacitive and inductive elements. The power splitter 600 includes inductors 608, 610 and 612, capacitors 614, 616, 618, 620 and 622, and resistors 624, 626 and 628. In general, the power splitter 600 receives a signal at input 602 and divides the signal between outputs 604 and 606. During operation of the power splitter 600, an input signal received at input 602 is inductively coupled to a voltage reference (e.g., electrical ground) by inductor 608. The signal is then split between two signal paths, with each signal path including capacitors 614, 616 coupled to inductors 610, 612. The two signal paths are each capacitively coupled through capacitors 618, 620 to the voltage reference (e.g., electrical ground). Capacitor 622 and resistors 624, 626 and 628 provide isolation between the paths. During operation of the power splitter 600, the signal is split between outputs 604 and 606, with the relative magnitudes of the two outputs determined by the lumped elements of the splitter 600. Specifically, splitter 600 provides an in-phase power divider having relatively high isolation between the outputs 604 and 606. Finally, it should be noted that the power splitter 600 is just one example of a type of power splitter that can be used and that other implementations are possible.

Figure 8:
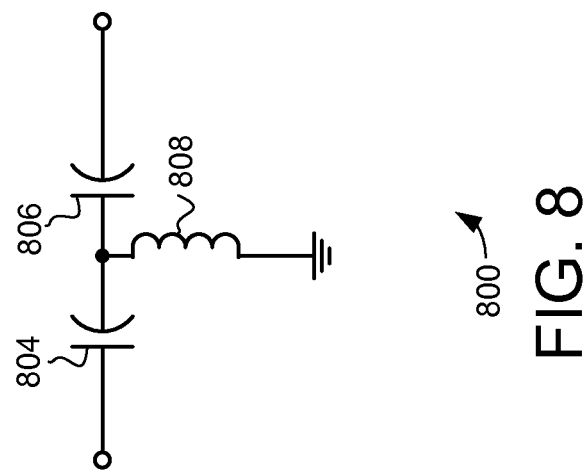
FIGS. 7-8 are schematic views of phase shifters in accordance with example embodiments.
Figure 7:
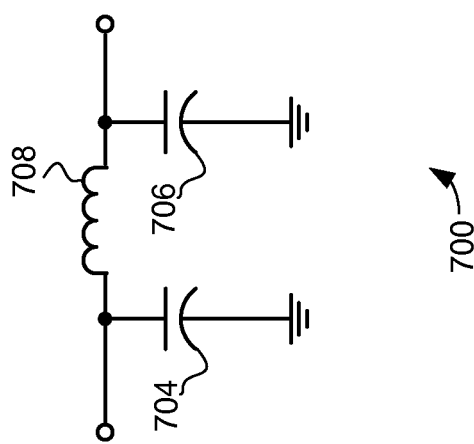

Turning now to FIGS. 7 and 8, embodiments of a lagging phase shifter 700 (e.g., lagging phase shifter 114, FIG. 1) and a leading phase shifter 800 (e.g., leading phase shifter 108, FIG. 1) are illustrated. These phase shifters 700, 800 are generally referred to as three pole filters, and are examples of types of phase shifters that can be utilized with the various embodiments. In other embodiments, phase shifters having more or fewer than three poles may be used. These phase shifters 700, 800 comprise lumped capacitive and inductive elements. For example, the lumped elements may be implemented as integrated passive devices (IPDs), in an embodiment. The lagging phase shifter 700 includes capacitors 704 and 706 and inductor 708. The leading phase shifter 800 includes capacitors 804 and 806 and inductor 808. In general, the lagging phase shifter 700 is a low pass filter configured to shift the phase of the incoming signal backward. Alternatively, the leading phase shifter 800 is a high pass filter configured to shift the phase of the incoming signal forward. In a typical implementation the phase shifters 700, 800 would be selected to provide about a 90 degree difference in phase between the two output signals. This can be accomplished by providing about a +45 degree phase shift with the leading phase shifter 800 and about a −45 phase shift with the lagging phase shifter 700. However, this is just one example, and in other embodiments other arrangements can be used such as about 30 and about 60 degree phase shifting. Finally, it should be noted that these are just two examples of the types of phase shifters that could be used.

Figure 10:
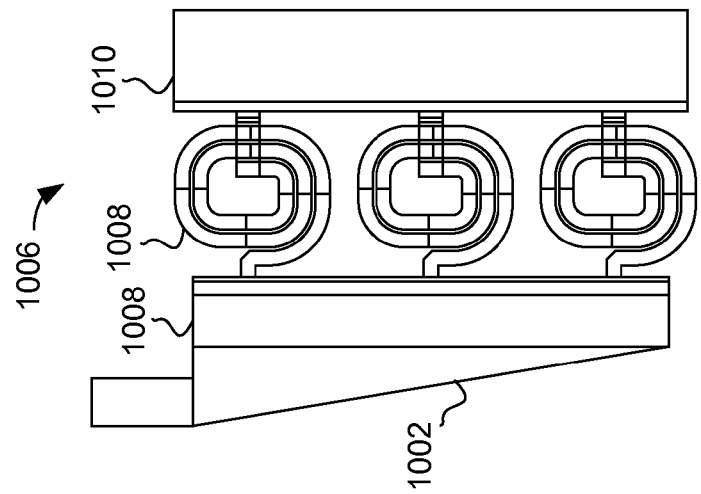
FIGS. 9-10 are top views of distribution networks, compensation resonators and phase shifters in accordance with example embodiments.
Figure 9:
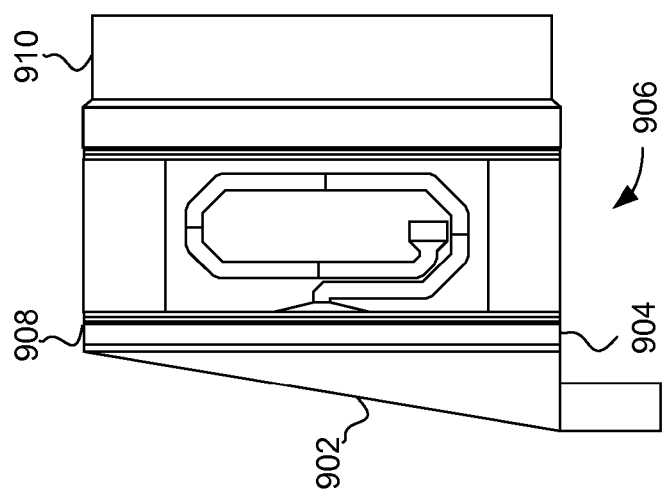

Turning now to FIGS. 9 and 10, top views of exemplary power distribution networks, compensation resonators and phase shifters are illustrated. Specifically, FIG. 9 shows an example of a first power distribution network 902, a first compensation resonator 904, and a lagging phase shifter 906. Likewise, FIG. 10 shows an example of a second power distribution network 1002, a second compensation resonator 1004, and a leading phase shifter 1006. As described above, each distribution network 902, 1002 includes a relatively wide output feedline connection to the compensation resonators 904, 1004. Likewise, each compensation resonator 904, 1004 includes relatively large electrodes. Together these can provide good signal distribution to the phase shifters 906, 1006. The phase shifters 906 and 1006 are likewise configured with relatively wide connections to facilitate good signal distribution.

In the illustrated embodiment of power distribution network 1002, the first series capacitor of the leading phase shifter 1006 (e.g., capacitor 804 of FIG. 8) and the capacitor of the resonator 1004 are provided together as one physical capacitor 1008. Capacitor 1008 may be an IPD or a discrete component, in various embodiments. This may simplify the fabrication by using one capacitor with an appropriately selected value to perform both functions. Specifically, the capacitor 1008 would be selected to provide both resonance with the distribution network 1002 and high pass filtering. However it should be noted that this is just one implementation, and that other implementations can use separate capacitors for these functions.

Next it should be noted that the series inductor of the lagging phase shifter 906 (e.g., inductor 708 of FIG. 7) is implemented as three physical inductors 908 in parallel, in the illustrated embodiment. Inductors 908 may be IPDs or discrete components, in various embodiments. This again facilitates improved signal distribution across the relatively wide connections between capacitors. However, this is again just one example and other configurations are possible (e.g., more or fewer inductors, and/or inductors arranged in series and/or parallel).

Finally, it should be noted that both the lagging phase shifter 906 and the leading phase shifter 1006 have relatively wide output connections 910 and 1010 that are again comparable in width to the output feedline width of the distribution networks 902 and 1002 and the connection widths of compensation resonators 904 and 1004. Furthermore, these connection widths can again be configured to be at least 10 percent of the operating signal wavelength. Finally, as will be described below the relatively wide output connections of the phase shifters can also be comparable in width to the bus bar width of the downstream transistors.

Figure 11:
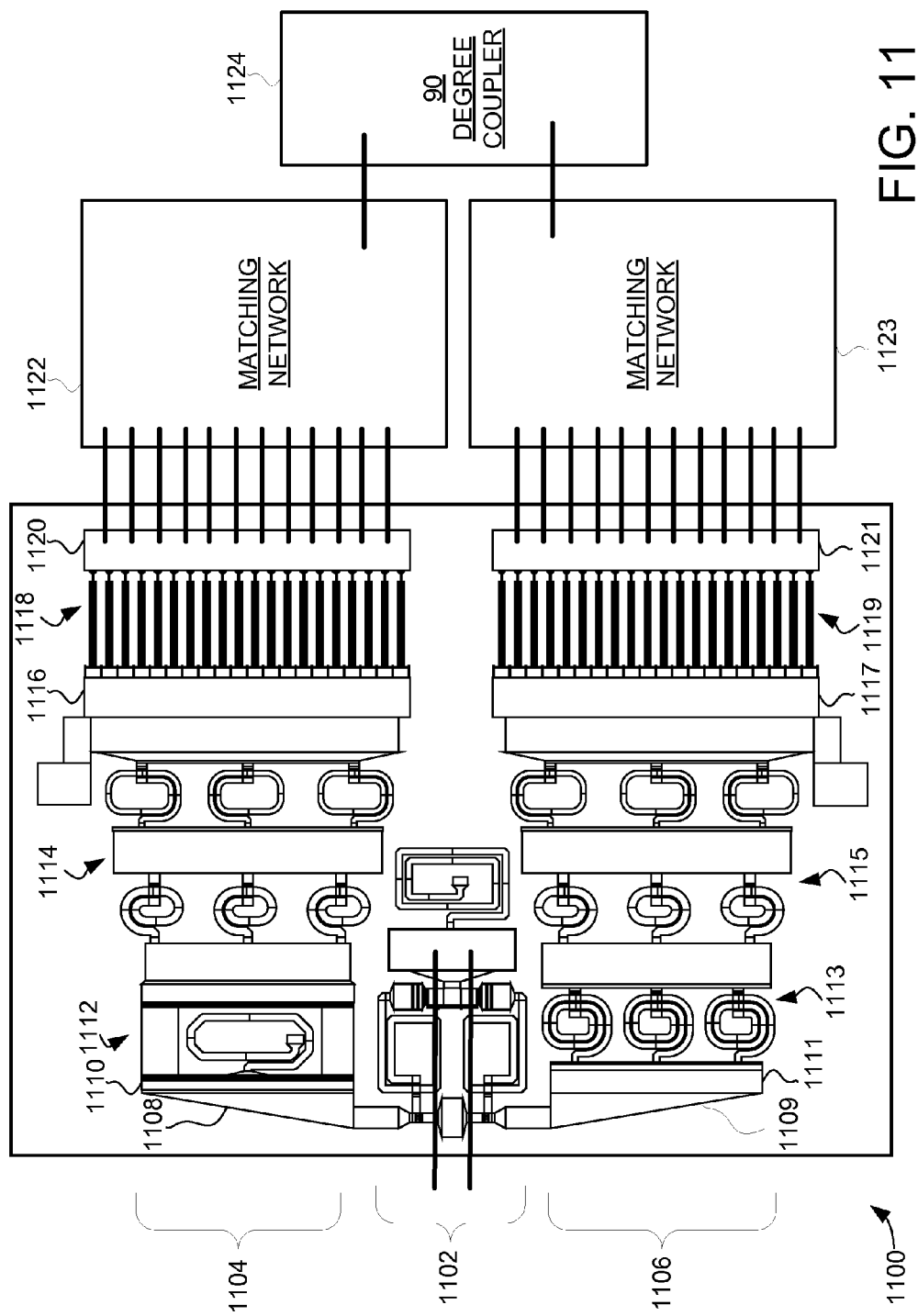
FIG. 11 is a combination top view and schematic view of a balanced amplifier in accordance with an example embodiment.

Turning now to FIG. 11, a combination top and schematic view of an embodiment of an exemplary balanced amplifier 1100 is illustrated. The balanced amplifier 1100 includes a power splitter 1102 that divides an incoming signal into two channels 1104 and 1106. Each channel includes a substantially triangular shaped power distribution network 1108, 1109, a compensator resonator 1110, 1111, and a phase shifter 1112, 1113. Coupled to each phase shifter 1112, 1113 is a matching network 1114, 1115, and coupled to each matching network is a first bus bar 1116, 1117. The connection to each first bus bar 1116, 1117 is a distributed interconnection. Each first bus bar 1116, 1117 provides a connection to a transistor 1118, 1119 in an array of transistors, each of which outputs to a second bus bar 1120, 1121. The second bus bars 1120, 1121 are coupled to output matching networks 1122, 1123 through bonding wires, which are then coupled to the 90 degree output coupler 1124.

In this arrangement the power splitter 1102, power distribution networks 1108, 1109, compensator resonators 1110, 1111, and phase shifters 1112, 1113 are parts of a hybrid coupler used to divide an input signal to the power splitter 1102 into two phase-shifted signals that are about 90 degrees out of phase from each other. These phase-shifted signals are provided to the transistors 1118, 1119 through matching networks 1114, 1115 and bus bars 1116, 1117. These two signals are then amplified separately by the transistors 1118, 1119, passed through the bus bars 1120, 1121 to the matching networks 1122, 1123. Finally, the two signals are recombined together using the coupler 1124. When so configured the balanced amplifier 1100 provides a variety of useful features, such as reduced reflection and increased immunity to load pull effects. As such they are particularly useful in RF applications.

As shown in FIG. 11, the balanced amplifier 1100 uses relatively wide connections to provide good signal distribution to the transistors 1118, 1119, and thus can provide improved performance. Specifically, the distribution networks 1108, 1109 and compensation resonators 1110, 1111 have relatively wide connections. In one embodiment, the output connection width of the distribution networks 1108, 1109 and the electrode connection width of the compensation resonators 1110, 1111 are both within 20 percent of the width of the bus bars 1116, 1117. In another embodiment the output connection width of the distribution networks 1108, 1109, the electrode connection width of the compensation resonators 1110, 1111 and the width of the bus bars 1116, 1117 are all greater than 10 percent of the operating signal wavelength. Having these relatively wide widths can provide improved signal distribution to the transistors 1118, 1119 while maintaining performance at the operating frequency of the transistors 1118, 1119.

The embodiments described herein thus can provide semiconductor devices with improved performance. In general the embodiments described herein can provide improved signal feeding between hybrid couplers and associated transistors through the use of relatively wide output connections. Embodiments include devices such as hybrid couplers and amplifiers that are typically used in radio frequency (RF) applications.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present.

Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematics shown in the figures depict several exemplary arrangements of elements, additional intervening elements, devices, features, or components may be present in other embodiments of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A multi-phase hybrid coupler comprising:
a power splitter, the power splitter including a first output terminal and a second output terminal configured to output an operating signal having a wavelength;
a first power distribution network, the first power distribution network having a first input node and a first output feedline, the first input node coupled to the first output terminal of the power splitter, the first output feedline having a first output connection width equal to at least 5 percent of the operating signal wavelength; and
a first compensation resonator coupled to the first output feedline of the first power distribution network.

2. The multi-phase hybrid coupler of claim 1, further comprising:
a second power distribution network, the second power distribution network having a second input node and a second output feedline, the second input node coupled to the second output terminal of the power splitter; and
a second compensation resonator coupled to the second output feedline of the second power distribution network.

3. The multi-phase hybrid coupler of claim 2 wherein the second output feedline has a second output connection width equal to at least 5 percent of the operating signal wavelength.

4. The multi-phase hybrid coupler of claim 2, further comprising:
a leading phase shifter coupled to the first compensation resonator and having an output terminal for supplying a first output signal with a first phase; and
a lagging phase shifter coupled to the second compensation resonator and having an output terminal for supplying a second output signal with a second phase, the second phase approximately 90 degrees from the first phase.

5. The multi-phase hybrid coupler of claim 4 wherein the leading phase shifter and the lagging phase shifter each comprise three pole filters.

6. The multi-phase hybrid coupler of claim 4 wherein the leading phase shifter and the lagging phase shifter are composed of lumped resistive, capacitive and inductive integrated passive devices.

7. The multi-phase hybrid coupler of claim 4 wherein the second output feedline has a second output connection width, the output terminal of the leading phase shifter is coupled to a first transistor through a first bus bar having a first bus bar width, and wherein the output terminal of the lagging phase shifter is coupled to a second transistor through a second bus bar having a second bus bar width, and wherein the first bus bar width is substantially equal to the first output connection width, and wherein the second bus bar width is substantially equal to the second output connection width.

8. The multi-phase hybrid coupler of claim 1 wherein the first compensation resonator includes a first capacitor and a first electrode and a second electrode, and wherein the first electrode has a width within 20 percent of the first output connection width.

9. The multi-phase hybrid coupler of claim 1 wherein the first input node has a first input node connection width, and wherein the first input connection width is less than 20 percent the first output connection width.

10. The multi-phase hybrid coupler of claim 1 wherein the first power distribution network has a shape configured to provide substantially uniform voltage along the first output feedline.

11. The multi-phase hybrid coupler of claim 1 wherein the first distribution network has a substantially triangular shape.

12. A multi-phase hybrid coupler comprising:
a power splitter, the power splitter including a first output terminal and a second output terminal configured to output an operating signal having a wavelength;
a first power distribution network, the first power distribution network having a first input node and a first output feedline, the first input node coupled to the first output terminal of the power splitter and having a first input width, the first output feedline having a first output connection width, and wherein the first input width is less than 20 percent of the output connection width; and
a first compensation resonator coupled to the first output feedline of the first power distribution network.

13. The multi-phase hybrid coupler of claim 12, further comprising:
a second power distribution network, the second power distribution network having a second input node and a second output feedline, the second input node coupled to the second output terminal of the power splitter; and
a second compensation resonator coupled to the second output feedline of the second power distribution network.

14. The multi-phase hybrid coupler of claim 13, further comprising:
a leading phase shifter coupled to the first compensation resonator and having an output terminal for supplying a first output signal with a first phase; and
a lagging phase shifter coupled to the second compensation resonator and having an output terminal for supplying a second output signal with a second phase, the second phase approximately 90 degrees from the first phase.

15. A balanced power amplifier comprising:
a power splitter, the power splitter including a first output terminal and a second output terminal;

a first power distribution network, the first power distribution network having a first input node and a first output feedline, the first input node coupled to the first output terminal of the power splitter, the first input node having a first input connection width, the first output feedline having a first output connection width;

a first compensation resonator coupled to the first output feedline of the first power distribution network, the first compensation resonator comprising a first capacitor having a first electrode, and wherein the first electrode has a first electrode width;

a second power distribution network, the second power distribution network having a second input node and a second output feedline, the second input node coupled to the second output terminal of the power splitter, the second input node having a second input connection width, the second output feedline having a second output connection width;

a second compensation resonator coupled to the second output feedline of the second power distribution network, the second compensation resonator comprising a second capacitor having a second electrode, and wherein the second electrode has a second electrode width;

a leading phase shifter coupled to the first compensation resonator and having an output terminal for supplying a first output signal with a first phase;

a lagging phase shifter coupled to the second compensation resonator and having an output terminal for supplying a second output signal with a second phase approximately 90 degrees from the first phase;

a first transistor coupled to the output terminal of the leading phase shifter through a first bus bar, the first bus bar having a first bus bar width;

a second transistor coupled to the output terminal of the lagging phase shifter through a second bus bar, the second bus bar having a second bus bar width;

wherein the first output connection width and the first electrode width are each within 20 percent of the first bus bar width; and wherein the second output connection width and the second electrode width are each within 20 percent of the second bus bar width.

16. The balanced power amplifier of claim 15 further comprising:
a first matching network coupled to the first transistor;
a second matching network coupled to the second transistor; and
a output coupler attached to the first transistor and the second transistor.

17. The balanced power amplifier of claim 15 wherein the first output connection width and the second output connection width are each at least 10 percent of an operating signal wavelength.

18. The balanced power amplifier of claim 15 wherein the first power distribution network has a shape configured to provide substantially uniform voltage along the first output feedline and wherein the second power distribution network has a shape configured to provide substantially uniform voltage along the second output feedline.

19. The balanced power amplifier of claim 15 wherein the first power distribution network has a substantially triangular shape and wherein the second power distribution network has a substantially triangular shape.

20. The balanced power amplifier of claim 15 wherein the first bus bar is coupled to the output terminal of the leading phase shifter with a distributed interconnect.

* * * * *